United States Patent [19]

Lien

[11] Patent Number: 5,510,744
[45] Date of Patent: Apr. 23, 1996

[54] CONTROL CIRCUIT FOR REDUCING GROUND AND POWER BOUNCE FROM AN OUTPUT DRIVER CIRCUIT

[75] Inventor: Chuen-Der Lien, Mountain View, Calif.

[73] Assignee: Integrated Device Technology, Inc., Santa Clara, Calif.

[21] Appl. No.: 426,488

[22] Filed: Apr. 20, 1995

Related U.S. Application Data

[63] Continuation of Ser. No. 66,906, May 24, 1993, abandoned.

[51] Int. Cl.[6] .............................. H03K 5/00; H03K 17/16
[52] U.S. Cl. .......................... 327/310; 327/379; 327/323; 327/108
[58] Field of Search ..................... 302/270, 542, 302/542.1, 543, 355, 359, 358, 576, 647; 327/379, 387, 384, 388, 389, 312, 313, 574, 576, 581, 108, 310, 323

[56] References Cited

U.S. PATENT DOCUMENTS

| | | | |
|---|---|---|---|
| 4,782,252 | 11/1988 | Levy et al. | 307/576 |
| 4,823,025 | 4/1989 | Spek | 307/576 |
| 4,947,063 | 8/1990 | O'Shaughnessy et al. | 307/270 |
| 5,057,720 | 10/1991 | Hattori | 307/270 |
| 5,121,082 | 6/1992 | Matsuzawa | 307/270 |
| 5,132,565 | 7/1992 | Kuzumoto | 327/142 |
| 5,166,544 | 11/1992 | Carobolante | 307/270 |
| 5,185,538 | 2/1993 | Kondoh et al. | 307/359 |
| 5,231,316 | 7/1993 | Thelen, Jr. | 327/513 |
| 5,293,082 | 3/1994 | Bathaee | 307/270 |

*Primary Examiner*—Timothy P. Callahan
*Assistant Examiner*—Dinh T. Le
*Attorney, Agent, or Firm*—Ronald L. Yin; Limbach & Limbach

[57] ABSTRACT

A control circuit for controlling the power or bounce of an output driver circuit is disclosed. The control circuit can sense the output voltage and/or the bounce and then adjust the control node voltage of the output driver circuit accordingly. In addition, the output circuit can discharge the output node to a lower voltage level before turning on the output driver circuit.

4 Claims, 3 Drawing Sheets

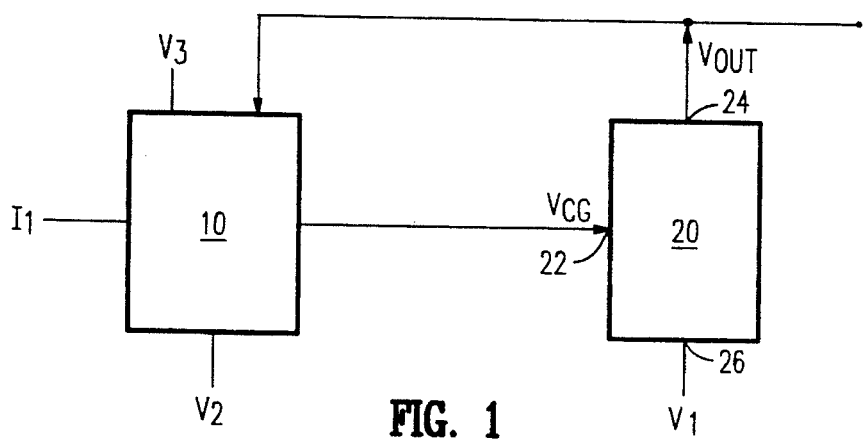
FIG. 1
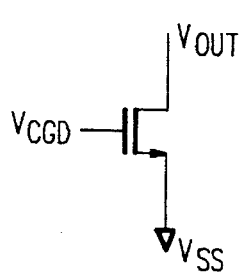
FIG. 2a
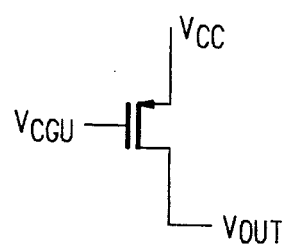
FIG. 2b
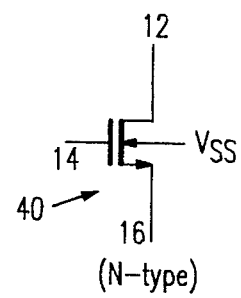
FIG. 3a (N-type)
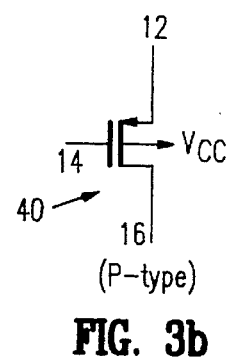
FIG. 3b (P-type)
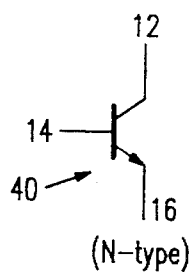
FIG. 3c (N-type)
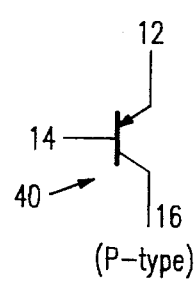
FIG. 3d (P-type)
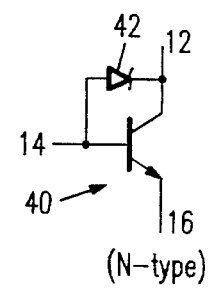
FIG. 3e (N-type)
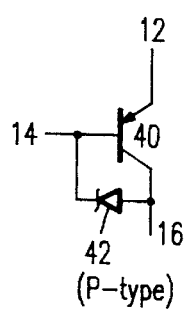
FIG. 3f (P-type)
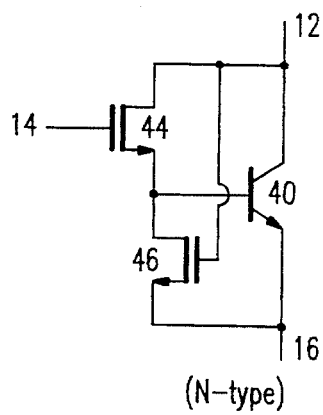
FIG. 3g (N-type)

(N-type)

(P-type)

(N-type)

(N-type)

(N-type)

(N-type)

(Gen. Rep.)

CONTROL CIRCUIT FOR REDUCING GROUND AND POWER BOUNCE FROM AN OUTPUT DRIVER CIRCUIT

This is a continuation of application Ser. No. 08/066,906 filed on May 24, 1993 now abandoned.

TECHNICAL FIELD

The present invention relates to a control circuit to control the bounce in the ground or other voltage source of an output driver circuit.

BACKGROUND OF THE INVENTION

Heretofore, output driver circuits are well known in the art. In certain high speed and high current output drivers of the integrated circuit type, when the state of an output driver is switched, transients are developed across stray inductances in the voltage source (typically Vcc) and ground (typically Vss) paths. The transients can cause bounces in the Vss and Vcc at the output stage. These transients are then coupled to other circuits in the same integrated circuit chip. In addition the transients can cause a voltage threshold level degradation at the input stages. Finally, the transients can introduce noise problems into the internal circuits of the integrated circuit device.

SUMMARY OF THE INVENTION

In the present invention, a control circuit for controlling an output driver circuit of an integrated circuit device is disclosed. The output driver circuit has a control terminal for receiving a control signal, an output terminal for supplying an output signal having a first voltage level, and a power terminal receiving a first voltage source. The control circuit of the present invention comprises means for receiving the output signal from the output terminal and means for receiving a second voltage source. It has optional means for receiving an input signal. The control circuit further has means for sensing the first voltage level of the output signal and generates the control signal supplied to the control terminal in response thereto.

BRIEF DESCRIPTION OF THE DRAWINGS

FIG. 1 is a schematic block level diagram of the control circuit of the present invention used with a prior art output driver circuit.

FIGS. 2A and 2B are prior art output driver circuits to which the control circuit of the present invention can be used.

DETAILED OF THE DESCRIPTION OF THE DRAWINGS

Figure 3H:
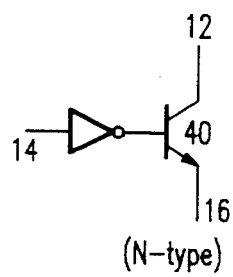
FIGS. 3(A–M) are various types of transistor circuits (designated as N-type or P-type) which can be used in the control circuit of the present invention, with FIG. 3(O) being a general representation of any of the transistor circuits shown in FIGS. 3(A–M).

Referring to FIG. 1 there is shown a schematic block level diagram of a control circuit 10 of the present invention for use with an output circuit 20. The output circuit 20 has a control terminal 22 for receiving a control signal Vcg. The output driver circuit 20 also comprise an output signal Vout supplied along an output terminal 24. The output signal Vout has a first voltage level. Finally, the output driver circuit 20 is connected to a first voltage source V1 at a power terminal 26.

The control circuit 10 of the present invention receives the output signal Vout from the output terminal 24. In addition, the control circuit 10 is connected to receive a second voltage source V2. The control circuit 10 also receives S1, which is the input signal controlling the control circuit 10. Finally, the control circuit 10 senses the first voltage level of the output signal Vout and generates the control signal Vcg which is supplied to the control terminal 22 in response thereto.

In general, the first voltage source V1 can be Vssn (for noisy Vss) or Vccn in (for noisy Vcc). Whether the output driver circuit 20 is connected to Vssn or Vccn depends upon whether the output driver circuit 20 is N-type or P-type. Similarly, the voltage source V2 to which the control circuit 10 is connected can be either Vss (quiet Vss) or Vssn. In addition, the control circuit 10 can be connected to V3 which is Vcc (quiet Vcc) or Vccn. Whether the control circuit 10 is connected to Vssn at V3 or Vccn at V2 depends upon whether the control circuit 10 is N-type or P-type.

There are many output driver circuits of the prior art to which the control circuit 10 of the present invention can be connected and to which the control circuit 10 can control.

Referring to FIG. 2A there is an N-type output driver circuit 20. The N-type output driver circuit 20 comprises simply an NMOS transistor having three terminals. The transistor is connected to a voltage source Vss. The transistor is connected to receive the control signal Vcgd. Finally, the transistor outputs Vout along its third terminal. The output driver circuit 20 shown in FIG. 2A is an NMOS pull down type. Thus, when Vcgd is turned on, Vout is then pulled down to Vss.

Referring to FIG. 2B there is shown a PMOS output driver circuit 20 of the prior art. The PMOS output driver circuit 20 of the prior art consists of a single PMOS transistor. The PMOS transistor has one terminal connected to receive the control signal Vcgu, one terminal connected to a high voltage source Vcc, and the third terminal outputs the output signal Vout. The output driver circuit 20 of the PMOS type shown in FIG. 2B is a pull up type in that when Vcgu is activated, the signal at Vout is pulled up to the level of Vcc.

Of course there are other types of output driver circuits 20 to which the control circuit 10 of the present invention can be used. Thus, the control circuit 10 can control a NMOS pull up type driver circuit 20, or a PMOS pull down type driver circuit 20.

Referring to FIGS. 3(A–M) there is shown a number of transistor circuits which can be used in the control circuit 10 of the present invention. For simplicity sake, they are characterized as either N-type or as P-type. Each of the transistor circuits has three terminals 12, 14, and 16.

Thus, referring to FIG. 3A there is shown a NMOS transistor 40 whose substrate is connected to Vss. The NMOS transistor 40 shown in FIG. 3A has a gate 14, a source or drain 12, and another source of drain 16. The transistor circuit 40 shown in FIG. 3A is characterized as N-type.

FIG. 3B shows a PMOS transistor 40. The substrate of the PMOS transistor 40 is connected to a source of high voltage potential, such as Vcc. The PMOS transistor 40 has a gate 14, a source or drain 12, and another drain of source 16. This circuit is characterized as P-type.

Referring to FIG. 3C there is shown an NPN bipolar transistor 40. The NPN bipolar transistor 40 has a collector 12, a base 14, and an emitter 16. This circuit is characterized as N-type.

Referring to FIG. 3D there is shown a PNP bipolar transistor 40. The PNP transistor 40 also has a collector 12, a base 14 and an emitter 16. This circuit is characterized as P-type.

Referring to FIG. 3E there is shown a NPN bipolar transistor 40 having a schottky diode 42 connected between the collector 12 and the base 14. Similar to the transistor circuit shown in FIG. 3C, there are three terminals, 12, 14 and 16. This circuit is characterized as N-type.

Referring to FIG. 3F, there is shown a PNP bipolar transistor 40 have a schottky diode 42 connected between the collector 12 and base 14. Similar to the transistor circuit shown in Figures 3E, the transistor circuit shown in FIG. 3F also has three terminals labeled 12, 14 and 16. This circuit is characterized as P-type.

Referring to FIG. 3G there is shown a NPN bipolar transistor 40 having a collector, base and emitter. A NMOS transistor 44 has a source connected to the collector of the NPN bipolar transistor 40, forming the first terminal 12 of the transistor circuit. The gate of the NMOS transistor 44 forms the second terminal 14 of the transistor circuit. The drain of the NMOS transistor 44 is connected to the base of the NPN bipolar transistor 40, and to the drain of a PMOS transistor 46. The gate of the PMOS transistor 46 is also connected to the collector of the NPN bipolar transistor 40. The source of the PMOS transistor 46 is connected to the emitter of the NPN bipolar transistor 40 and forms the third terminal 16 of the transistor circuit. This circuit is characterized as N-type.

Referring to FIG. 3H there is shown an NPN bipolar transistor 40 with a diode 48 connected to its base 14. This circuit has three terminals: collector 12, input 14 to diode 48, and base 16. This circuit is characterized as N-type.

Figure 3I:
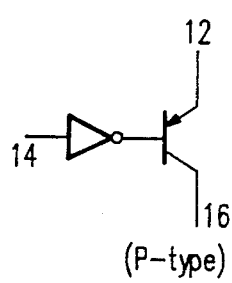

Referring to FIG. 3I there is shown a PNP bipolar transistor 40 with a diode 48 connected to its base 14. Similar to the other embodiments, this circuit also has three terminals: collector 12, input 14 to diode 48 and base 16.

Figure 3J:
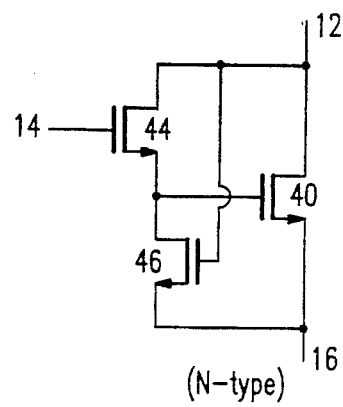

Referring to FIG. 3J there is shown a first NMOS transistor having a source, a gate and a drain. A second NMOS transistor 44 has its source connected to the source of the first NMOS transistor 40, forming the first terminal 12 of the transistor circuit. The gate of the second NMOS transistor 44 forms the second terminal of the transistor circuit. The drain of the second NMOS transistor 44 is connected to the gate of the first NMOS transistor 40, and to the source of a third NMOS transistor 46. The gate of the third NMOS transistor 46 is also connected to the source of the first NMOS transistor 40. The drain of the third NMOS transistor 46 is connected to the drain of the first NMOS transistor 40 and forms the third terminal 16 of the transistor circuit. This circuit is characterized as N-type.

Figure 3K:
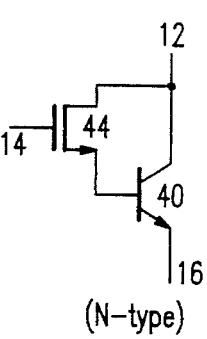

Referring to FIG. 3K there is shown a transistor circuit having two NPN bipolar transistors 40 and 44 connected. The collectors of the two bipolar transistors 40 and 44 are connected in common and form the first terminal 12. The base of the second NPN transistor 44 forms the second terminal 14. The emitter of the second NPN transistor 44 is connected to the base of the first NPN transistor 40. The emitter of the first NPN transistor 40 forms the third terminal 16. This transistor circuit is characterized as N-type.

Figure 3L:
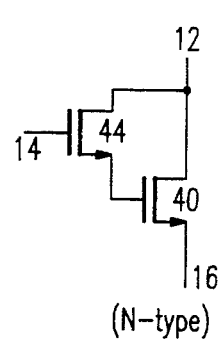

Referring to FIG. 3L there is shown yet another transistor circuit having an NPN bipolar transistor 40 with a NMOS transistor 44. The source or drain of the NMOS transistor 44 is connected to the base of the NPN bipolar transistor 40. The other source or drain of the NMOS transistor 44 is connected to the collector of the NPN bipolar transistor 40 and forms the first terminal 12. The gate of the NMOS transistor 44 forms the second terminal 14. The emitter of the NPN bipolar transistor 40 forms the third terminal 16. This transistor circuit is characterized as N-type.

Figure 3M:
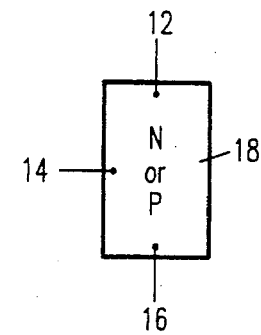

Referring to FIG. 3M there is shown another transistor circuit having two NMOS transistors 40 and 44 connected together. The source or drain of the second NMOS transistor 44 is connected to the gate of the first NMOS transistor 40. The other source or drain of the second NMOS transistor 44 is connected to the source or drain of the first NMOS transistor 40 and forms the first terminal 12. The gate of the second NMOS transistor 44 forms the second terminal 14. The drain of the first NMOS transistor 40 forms the third terminal 16. This transistor circuit is characterized as N-type.

Figure 3O:
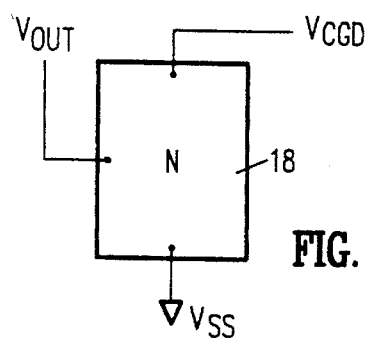

FIG. 3O is a general representation of any of the transistor circuits 18 shown in FIGS. 3(A–M) with any of those circuits characterized as either P-type or N-type. The generalized representation of the transistor circuit 18 shown in FIG. 3O has three terminals labeled 12, 14 and 16.

Figure 4A:
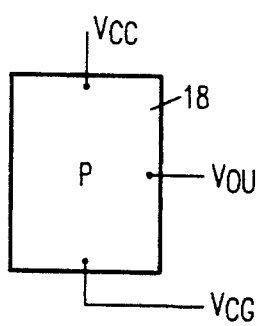
FIGS. 4A and 4B are block level diagrams of the control circuit of the present invention wherein the control circuit can sense the first voltage level of the output signal and can generate the control signal in response thereto using the N-type or P-type transistor circuits shown in FIG. 3(A–M). In this case there is no input signal S1.

Referring to FIG. 4A there is shown one embodiment of the control circuit 10 of the present invention. In the embodiment shown in FIG. 4A, the control circuit 10 comprises an N-type transistor circuit 18 of any of the N-types shown in FIGS. 3(A–M). The control circuit 10 has three control terminals 12, 14 and 16. Terminal 14 is connected to receive the Vout signal from node 24 of the output driver circuit 20. Terminal 16 of the control circuit 10 is connected to a source of voltage supply Vss. Terminal 12 of the transistor circuit 18 is connected to generate the control signal Vcgd, which is supplied to the output driver circuit 20 at node 22. In this case, there is no input signal I1 supplied to control circuit 10. In this embodiment, when input voltage Vi goes high, Vout needs to switch from high to low. Before Vout becomes really low, Vcgd (Vi) won't go high all the way. That is, the control circuit 10 senses the output voltage Vout and then adjusts the voltage of the control signal Vcgd supplied to the output driver circuit 20 at node 22. The N-type transistor circuit 18 shown in FIG. 4A is used to control an output driver circuit 20 of the N-type. The output discharge current is controlled by the difference between Vcgd and Vss within the output driver circuit 20. This is kept low when Vout–Vss is high. Quite Vss is preferred to the control circuit such that when the ground bounce (the difference between Vss and Vssn (where Vssn is the noisy Vss voltage level), is high) the output current Vout can be further reduced due to the smaller Vcgd–Vssn.

Figure 4B:
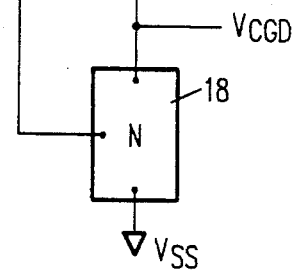

Similarly, referring to FIG. 4B there is shown another embodiment of the control circuit 10 of the present invention. In this embodiment shown in FIG. 4B, the control circuit 10 comprises a P-type transistor circuit 18, shown as anyone of the P-type embodiments in FIGS. 3(A–M). The embodiment shown in FIG. 4B is adapted to control a N-type pull down output driver circuit 20. Similarly, in this embodiment of the control circuit 10, the control circuit 10 has three terminals. One terminal is connected to Vcc. Another terminal receives the output signal Vout from the output driver circuit 20. Finally, the control circuit 10 generates a control signal Vcgd, which is supplied to the output driver circuit 20. Similarly, in this embodiment, the output discharge current is controlled by Vcgd–Vssn, which is kept low when Vout is high. When Vout is low, Vcgd is then pulled high all the way to Vcc.

Referring to FIGS. 5(A–D) there are shown various embodiments of the control circuit 10, each of which can sense the output voltage Vout and/or the bounce and then adjust the control voltage (Vcgd) of the output driver accordingly and discharge the output node Vout to a lower voltage level before turning on the output driver completely (that is Vi going high all the way).

Figure 5A:
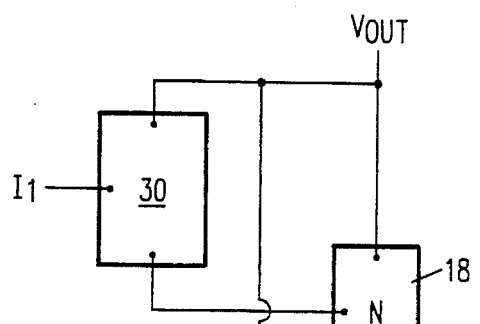
FIGS. 5(A–D) are various embodiments of the control circuit of the present invention wherein the control circuit can sense the first voltage level of the output signal and can generate the control signal in response thereto and can discharge the output signal to a voltage level lower than the first voltage level prior to generating the control signal, using the N-type or P-type transistor circuits shown in FIG. 3 (A–M).

In FIG. 5A, a conventional transistor 30 having three terminals receives the Vout signal through terminal 12. The transistor can be N- or P-type. The terminal 14 receives the input signal S1. Terminal 16 of the transistor 30 generates the signal which is applied to a first N-type transistor circuit 18a, along its second terminal 14. The first terminal 12 of the N-type transistor circuit 18a receives the Vout signal. A second N-type transistor circuit 18b has its first terminal 12 connected to the third terminal 16 of the first transistor circuit 18a. The second terminal 14 of the second N-type transistor circuit 18b also receives the Vout signal. Finally, the third terminal 16 of the second N-type transistor circuit 18b is connected to a voltage source Vss. From the connection of the first terminal 12 of the second N-type transistor circuit 18b and the third terminal 16 of the first transistor circuit 18a is supplied the control signal Vcg.

In operation, when Vout needs to go low (normally it is induced by Vi going high) input signal S1 turns on transistor 30. The first N-type transistor circuit 18a is turned on as a diode connection. Vout can be discharged through two paths. One is through two N-type transistors (18a and 18b to Vss. The other through output driver 20 to Vssn (which is part of the output driver 20 as discussed heretofore and is not shown). The second path is controlled by Vcgd–Vssn. The Vcgd is controlled the same way. The diode connection of the first N-type transistor circuit 18a is used to avoid the charges at Vcg leak to Vout when Vcg becomes higher than Vout.

Figure 5B:
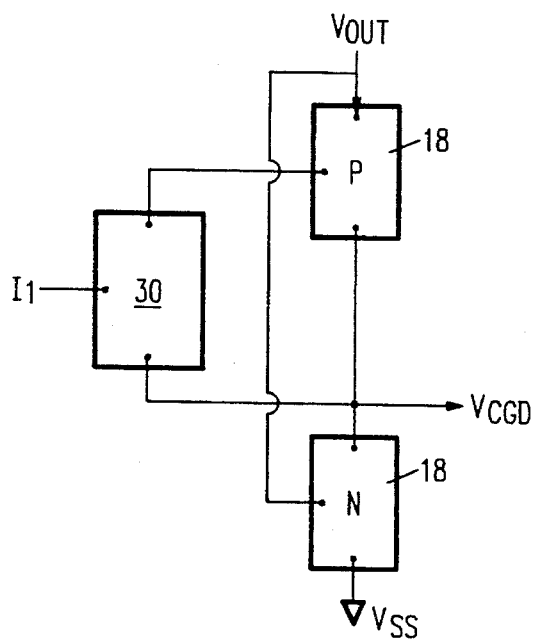

Referring to FIG. 5B there is shown another embodiment of the control circuit 10 of the present invention. The control circuit 10 comprises a transistor 30 having a first, second and a third terminal. In addition, the control circuit 10 comprises a P-type transistor circuit 18a and an N-type transistor circuit 18a. The Vout signal from the output driver circuit 20 is supplied to the first terminal 12 of the P-type transistor circuit 18a and to the second terminal of the N-type transistor circuit 18. The second terminal 14 of the P-type transistor circuit 18a is connected to one of the terminals of the transistor 30. A control signal S1, is supplied to a second node of the transistor 30. Finally, the third terminal of 16 the transistor 30 is connected to the third terminal 16 of the P-type transistor circuit 18a and to the first terminal 12 of the N-type transistor circuit 18b and is supplied as the control signal Vcgd to the output driver circuit 20. The third terminal 16 of the N-type transistors circuit 18b is connected to a voltage source Vss.

Similar to the embodiment shown in FIG. 5A, in the operation of the embodiment shown in FIG. 5B, when Vout goes low, transistor 30 is turned on so that P-type transistor circuit 18a is turned on as a diode connection. In addition, Vout can be discharged through a circuit path connecting the P-type transistor circuit 18a and the N-type transistor circuit 18b. The operation is the same as that of FIG. 5A.

Figure 5C:
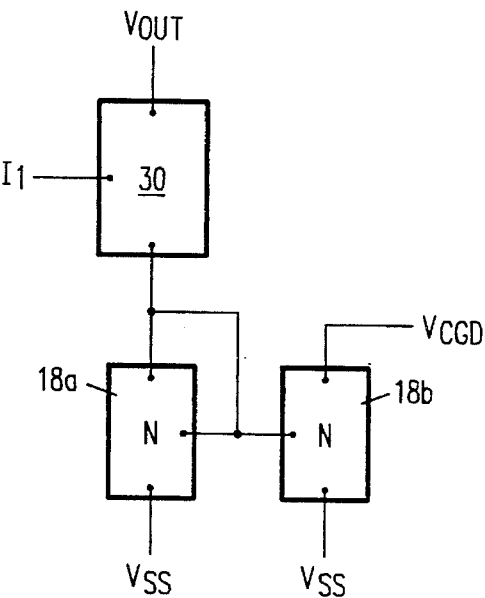

Referring to FIG. 5C, there is shown another embodiment of the control circuit 10 of the present invention. In this embodiment, a current mirrored circuit is disclosed which senses the Vout signal and controls Vcgd. In this embodiment, a transistor 30 has three terminals one of which terminal 12 receives the Vout signal. Another terminal 14 receives the control signal S1. A third terminal 16 is connected to a first terminal 12 of a first N-type transistor circuit 18a. In addition, the signal from the third terminal 16 of the transistor 30 is connected to the second terminal 14 of the first N-type transistor circuit 18a. Finally, the third terminal 16 of the first N-type transistor circuit 18a is connected to a voltage source Vss. A second N-type transistor circuit 18b has its second terminal 14 for receiving the signal from the third terminal of the transistor 30 and the second terminal 14 of the first transistor circuit 18a. The third terminal 16 of the second transistor circuit 18b is also connected to a voltage Vss. The first terminal 12 of the second transistor circuit 18B provides the control signal Vcgd.

In this embodiment, the Vout signal can be discharged through the transistor 30 and through the first N-type transistor circuit 18a. In addition, in this embodiment, the control circuit 10 can connect Vss to the second node 14 of the first transistor circuit 18a and the Vss can be connected to the second node 14 of the second N-type transistor circuit 18b. This ground bounce sensing for N-type transistor circuits 18a and 18b is particularly sensitive when NPN bipolar transistors (with or without schottky diode), such as that embodiment shown in FIG. 3E are used.

Figure 5D:
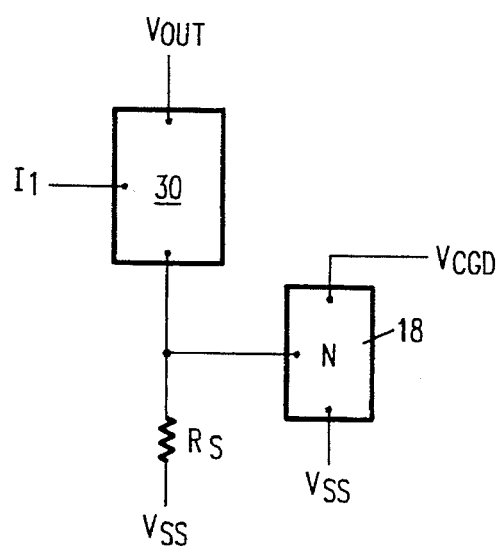

Referring to FIG. 5D there is shown yet another embodiment of the control circuit 10 of the present invention. The control circuit 10 comprises a transistor 30 connected to an N-type transistor circuit 18. The transistor 30 has three terminals adapted to receive Vout, and a control signal S1, along its first and second nodes. The third node of the transistor 30 is connected to Vss or ground through a resistor Rs. In addition, the third node of the transistor 30 is connected to the second node 14 of the N-type transistor circuit 18. The third node 16 of the transistor 18 is connected to a voltage source, Vss, such as ground. Finally, the first node 12 of the transistor 18 provides the control signal Vcgd.

In operation, the control circuit 10 of the embodiment shown in FIG. 5D operates similarly to the control circuit 10 shown in FIG. 5C except transistor circuit 18a is replaced with a resistor Rs.

Control circuit shown in FIGS. 4(A–B), 5(A–D) are used to control an N-type pull down output driver. Each of the embodiments of the control circuit can also be used to control a P-type pull down output driver circuit 20. In that event, the voltage source Vss to which each of the control circuit 10 is connected is changed from Vss to Vcc and Vcc to Vss. In addition, for a P-type control node of a pull up type for controlling a pull up driver circuit 20, the control circuit 10 is changed by changing Vss to Vcc, Vcc to Vss and each of the N-type transistor circuit 18 to a P-type transistor circuit, P-type transistor to N-type transistor, and Vcgd to Vcgu.

Finally, for the control circuit 10 to control an N-type output driver circuit 20 of the "pull up" type, each of the N-type transistor circuits 18 shown in the various embodiments is changed to a P-type, and the P-type to N-type, and Vcgd is changed to Vcgu.

There are many advantages of the control circuit 10 of the present invention. In particular, by simply changing P-type to N-type as shown in the various embodiments, the control circuit 10 can control a variety of P-type or N-type output driver circuits 20 of the pull up or pull down type.

In the prior art, without control circuit, an input voltage Vi applies to Vcg of output driver. In this invention, the same input voltage is still applied to Vcg (not shown in the figures).

What is claimed is:

1. A control circuit for controlling an output driver circuit, said output driver circuit for receiving a control signal and for generating an output signal having a first voltage level, said control circuit comprising:

a first transistor means having a first input node for receiving an input signal, a second node for receiving said output signal from said output driver circuit, and a third node for providing a third signal;

a first N-type transistor circuit means having a first input node for receiving said third signal from said first transistor means, a second node for receiving said output signal from said output driver circuit, and a third node for providing said control signal supplied to said control terminal; and a second N-type transistor circuit means having a first input node for receiving said output signal from said output driver circuit, a second input node connected to said third node of said first N-type transistor circuit means, and a third node for receiving a first voltage source.

2. A control circuit for controlling an output driver circuit, said output driver circuit for receiving a control signal, and for generating an output signal having a first voltage level, said control circuit comprising:

a first transistor means having a first input node for receiving an input signal, a second node and a third node;

a P-type transistor circuit means having a first input node connected to said second node of said first transistor means, a second node for receiving said output signal from said output driver circuit, a third node connected to said third node of said first transistor means to provide said control signal to said control terminal; and a N-type transistor circuit means having a first input node for receiving said output signal from said output driver circuit, a third node connected to said third node of said first transistor means, and a second node for receiving a first voltage source.

3. A control circuit for controlling an output driver circuit, said output driver circuit for receiving a control signal, and for generating an output signal having a first voltage level, said control circuit comprising:

a first transistor means having a first input node for receiving an input signal, a second node for receiving said output signal from said output driver circuit, and a third node for providing a third signal;

a first N-type transistor circuit means having a first input node for receiving said third signal from said first transistor means, a second node for receiving said third signal from said first transistor means, and a third node for receiving a first voltage source; and a second N-type transistor circuit means having a first input node for receiving said third signal from said first transistor means, a second node for providing said control signal to said control terminals and a third node for receiving said first voltage source.

4. A control circuit for controlling an output driver circuit, said output driver circuit for receiving a control signal, and for generating an output signal having a first voltage level, said control circuit comprising:

a first transistor means having a first input node for receiving an input signal, a second node for receiving said output signal from said output driver circuit, and a third node for providing a third signal;

a second transistor circuit means having a first input node for receiving said third signal from said first transistor means, a second node for providing said control signal supplied to said control terminal; a third node for receiving a first voltage source; and an impedance means connected to said third node of said first transistor means and to said first voltage source.

* * * * *